US012660088B2

(12) United States Patent
Oh

(10) Patent No.: US 12,660,088 B2
(45) Date of Patent: Jun. 16, 2026

(54) DISPLAY DEVICE

(71) Applicant: Samsung Display Co., LTD., Yongin-si (KR)

(72) Inventor: Myong-Soo Oh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 493 days.

(21) Appl. No.: 18/236,542

(22) Filed: Aug. 22, 2023

(65) Prior Publication Data

US 2024/0179846 A1    May 30, 2024

(30) Foreign Application Priority Data

Nov. 28, 2022    (KR) ........................ 10-2022-0161079

(51) Int. Cl.
| | |
|---|---|
| *H05K 1/14* | (2006.01) |
| *H05K 1/02* | (2006.01) |
| *H10K 59/131* | (2023.01) |
| *H10K 59/90* | (2023.01) |
| *H10W 90/00* | (2026.01) |

(52) U.S. Cl.
CPC ........... *H05K 1/148* (2013.01); *H05K 1/0269* (2013.01); *H05K 2201/09063* (2013.01); *H05K 2201/10128* (2013.01); *H05K 2201/10378* (2013.01); *H05K 2201/1053* (2013.01); *H10K 59/131* (2023.02); *H10K 59/90* (2023.02); *H10W 90/00* (2026.01)

(58) Field of Classification Search
CPC ................. H05K 1/148; H05K 1/0269; H05K 2201/09063; H05K 2201/10128; H05K 2201/10378; H05K 2201/1053; H10K 59/131; H10K 59/90; H10W 90/00
See application file for complete search history.

(56) References Cited

U.S. PATENT DOCUMENTS

| | | | |
|---|---|---|---|
| 10,303,014 B2 | 5/2019 | Oh | |
| 2017/0135213 A1* | 5/2017 | Lee | ......................... G02F 1/1333 |
| 2019/0281700 A1 | 9/2019 | Pyun et al. | |
| 2020/0258971 A1* | 8/2020 | Oh | ........................ G09G 3/3225 |
| 2020/0411778 A1* | 12/2020 | Song | .................. H10K 59/8794 |

(Continued)

FOREIGN PATENT DOCUMENTS

| | | |
|---|---|---|
| KR | 100261975 B1 | 7/2000 |
| KR | 20170080893 A | 7/2017 |

(Continued)

*Primary Examiner* — Peniel M Gumedzoe
(74) *Attorney, Agent, or Firm* — CANTOR COLBURN LLP

(57) ABSTRACT

A display device includes a display panel including a plurality of pixels and a plurality of display pads respectively connected to the pixels, a first circuit board including a first pad electrically connected to a first display pad, a second circuit board including a second pad electrically connected to a second display pad, a connection film including a base film, a first connection pad electrically connected to the first pad, a second connection pad electrically connected to the second pad, a signal line, and an alignment mark, where the alignment mark is spaced apart from the first connection pad and the second connection pad in a plan view when viewed in a thickness direction of the display device, and a cover disposed on the front surface of the base film, where the cover is spaced apart from the alignment mark in the plan view.

20 Claims, 15 Drawing Sheets

(56)　　　　　　References Cited

U.S. PATENT DOCUMENTS

| 2022/0013613 A1* | 1/2022 | Kim | ................... | G02F 1/13452 |
| 2022/0071011 A1 | 3/2022 | Ryu et al. | | |

FOREIGN PATENT DOCUMENTS

| KR | 20170139214 A | 12/2017 |
| KR | 20190107243 A | 9/2019 |
| KR | 20220030412 A | 3/2022 |

* cited by examiner

PCB4

CV

PCB3

PCB1

CV

PCB2

FCB

DISPLAY DEVICE

This application claims priority to Korean Patent Application 10-2022-0161079, filed on Nov. 28, 2022, and all the benefits accruing therefrom under 35 U.S.C. § 119, the content of which in its entirety is herein incorporated by reference.

BACKGROUND

1. Field

Embodiments of the disclosure described herein relate to a display device, and more particularly, to a display device capable of preventing a foreign material from entering into a circuit board.

2. Description of the Related Art

Various display devices used in multimedia devices such as televisions, mobile phones, tablet computers, navigation devices, and game consoles are being developed. The display device may be classified into a transmissive display device that selectively transmits source light generated from a light source therethrough, and a light-emitting display device that generates source light from the display device itself.

SUMMARY

A display device typically includes several components such as a plurality of circuit boards electrically connected to each other. Because a foreign material may flow between components, technology for preventing the foreign material from inflowing between components is desired.

Embodiments of the disclosure provide a display device capable of preventing the foreign material from inflowing between a circuit board and a connection film.

Embodiments of the disclosure provide a display device capable of reducing a space between a circuit board and a connection film into which the foreign material may flow.

Embodiments of the disclosure provide a display device capable of minimizing a space between a circuit board and a connection film into which the foreign material flows, and of preventing misalignment between components of the display device.

According to an embodiment, a display device includes a display panel including a plurality of pixels and a plurality of display pads respectively connected to the pixels, a first circuit board including a first pad electrically connected to a first display pad among the display pads, a second circuit board including a second pad electrically connected to a second display pad among the display pads, a connection film connected to the first circuit board and the second circuit board, where the connection film includes a base film, a first connection pad disposed on a front surface of the base film and electrically connected to the first pad, a second connection pad disposed on the front surface of the base film and electrically connected to the second pad, a signal line connecting the first connection pad and the second connection pad to each other, and an alignment mark disposed on the front surface of the base film, where the alignment mark is spaced apart from the first connection pad and the second connection pad in a plan view of the display device, and a cover disposed on the front surface of the base film, where the cover is spaced apart from the alignment mark in the plan view.

In an embodiment, the first pad and the second pad may be arranged along a first direction, where the first connection pad and the second connection pad may be arranged along the first direction and may be spaced apart from each other by a predetermined distance, where the alignment mark may be spaced from the first connection pad and the second connection pad by a predetermined distance in a direction different from the first direction.

In an embodiment, the display device may further include a first adhesive member disposed between the first circuit board and the connection film, and a second adhesive member disposed between the second circuit board and the connection film, where the first adhesive member may substantially overlap the first pad in the plan view, and the second adhesive member may substantially overlap the second pad in the plan view.

In an embodiment, the first adhesive member may overlap a portion of the first connection pad in the plan view, where the second adhesive member may overlap a portion of the second connection pad in the plan view.

In an embodiment, the cover may not substantially overlap the first adhesive member and the second adhesive member in the plan view.

In an embodiment, the alignment mark may include a plurality of alignment marks, where the connection film may includes a first portion in which the first connection pad and at least one of the alignment marks may be disposed, a second portion spaced apart from the first portion in the first direction, where the second connection pad and at least another one of the alignment marks may be disposed in the second portion, and a third portion connecting the first portion and the first portion to each other, the signal line is disposed in the third portion, the third portion may include a bent portion bent along the first direction, and the signal line may extend along the bent portion.

In an embodiment, the alignment mark may be defined by an opening defined in the base film.

In an embodiment, the cover may be integrally formed with the connection film as a single unitary and indivisible part.

In an embodiment, the cover may be substantially in contact with at least one selected from the first circuit board and the second circuit board.

In an embodiment, the display device may further include a circuit film connecting the first circuit board and the display panel to each other and connecting the second circuit board and the display panel to each other, where the first pad is electrically connected to the first display pad via the circuit film, and the second pad is electrically connected to the second display pad via the circuit film.

In an embodiment, the display device may further include a third circuit board including a third pad electrically connected to a third display pad among the display pads, a fourth circuit board including a fourth pad electrically connected to a fourth display pad among the display pads, and an additional connection film electrically connecting the third circuit board and the fourth circuit board to each other, where the third circuit board and the fourth circuit board may be spaced apart from each other in the first direction.

In an embodiment, the display device may further a lower member interposed between the display panel and the connection film.

In an embodiment, the display device may further a securing member interposed between the connection film and the lower member, where the securing member may fix the lower member and the connection film to each other.

According to an embodiment, a display device includes a display panel including a plurality of pixels and a plurality of display pads respectively connected to the pixels, a light conversion panel disposed opposite to the display panel, a first circuit board including a first pad electrically connected to a first display pad among the display pads, a second circuit board including a second pad electrically connected to a second display pad among the display pads, a connection film connected to the first circuit board and the second circuit board, where the connection film includes a base film, a first connection pad disposed on a front surface of the base film and electrically connected to the first circuit board, a second connection pad disposed on the front surface of the base film and electrically connected to the second circuit board, a signal line connecting the first connection pad and the second connection pad to each other, and an alignment mark disposed on the front surface of the base film, where the alignment mark is spaced apart from the first connection pad and the second connection pad in a plan view of the display device, and a cover disposed on the front surface of the base film, where the cover is spaced apart from the alignment mark in the plan view.

In an embodiment, the first pad and the second pad may be arranged along a first direction, where the first connection pad and the second connection pad may be arranged along the first direction and may be spaced apart from each other by a predetermined distance, and the alignment mark may be spaced from the first connection pad and the second connection pad by a predetermined distance in a direction different from the first direction.

In an embodiment, the display device may further include a first adhesive member disposed between the first circuit board and the connection film, and a second adhesive member disposed between the second circuit board and the connection film, where the first adhesive member may substantially overlap the first pad in the plan view, and the second adhesive member may substantially overlap the second pad in the plan view.

In an embodiment, the alignment mark may include a plurality of alignment marks, where the connection film may include a first portion in which the first connection pad and at least one of the alignment marks may be disposed, a second portion spaced apart from the first portion in the first direction, where the second connection pad and at least another one of the alignment marks may be disposed in the second portion, and a third portion connecting the first portion and the first portion to each other, where the signal line may be disposed in the third portion, the third portion may include a bent portion bent along the first direction, the signal line may extend along the bent portion, and the alignment mark may be defined by an opening defined in the base film.

According to an embodiment, a display device includes a display panel including a plurality of pixels and a plurality of display pads respectively connected to the pixels, a first circuit board including a first pad electrically connected to a first display pad among the display pads, a second circuit board including a second pad electrically connected to a second display pad among the display pads, a connection film connected to the first circuit board and the second circuit board, where the connection film includes a base film, a first connection pad disposed on a front surface of the base film and electrically connected to the first circuit board, a second connection pad disposed on the front surface of the base film and electrically connected to the second circuit board, a signal line connecting the first connection pad and the second connection pad to each other, and an alignment mark disposed on the front surface of the base film, where the alignment mark is spaced apart from the first connection pad and the second connection pad in a plan view of the display device, a first adhesive member disposed between the first circuit board and the connection film, a second adhesive member disposed between the second circuit board and the connection film, and a cover disposed on the front surface of the base film, where the cover is spaced apart from the alignment mark in the plan view, and the cover does not substantially overlap the first adhesive member and the second adhesive member in the plan view.

In an embodiment, the alignment mark may include a plurality of alignment marks, where the connection film may include a first portion in which the first connection pad and at least one of the alignment marks may be disposed, a second portion spaced apart from the first portion in one direction parallel to a direction in which the first connection pad and the second connection pad are arranged, where the second connection pad and at least another one of the alignment marks may be disposed in the second portion, and a third portion connecting the first portion and the second portion to each other, where the signal line may be disposed in the third portion, the third portion may include a bent portion bent along the one direction, the signal line may extend along the bent portion, and the alignment mark may be defined by an opening defined in the base film.

In an embodiment, The display device may further include a circuit film connecting the first circuit board and the display panel to each other and connecting the second circuit board and the display panel to each other, wherein the first pad may be electrically connected to the first display pad via the circuit film, wherein the second pad may be electrically connected to the second display pad via the circuit film.

BRIEF DESCRIPTION OF THE DRAWINGS

The above and other features of embodiments of the disclosure will become apparent by describing in detail embodiments thereof with reference to the accompanying drawings.

FIG. 3A to FIG. 3C are plan views of a display device according to an embodiment of the disclosure.

DETAILED DESCRIPTION

Figure 1A:
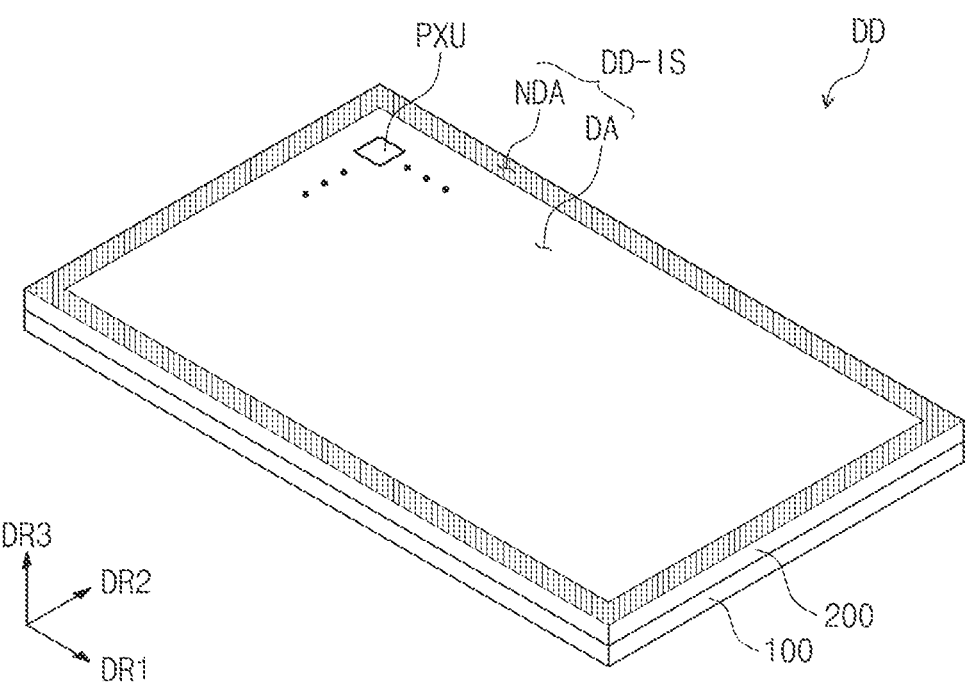
FIG. 1A is a perspective view of a display device according to an embodiment of the disclosure.

The reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

As used herein, when a component (or a region, a layer, a portion, and the like) is referred to as being "on", "connected to", or "coupled to" another component, it means that the component may be directly disposed/connected/coupled on another component or a third component may be disposed between the component and another component.

Like reference numerals refer to like components. In addition, in the drawings, thicknesses, ratios, and dimensions of components are exaggerated for effective description of technical content.

Terms such as first, second, and the like may be used to describe various components, but the components should not be limited by the terms. The above terms are used only for the purpose of distinguishing one component from another. For example, without departing from the scope of the disclosure, a first component may be named as a second component, and similarly, the second component may also be named as the first component.

In addition, terms such as "beneath", "below", "on", "above" are used to describe the relationship of the components illustrated in the drawings. The above terms are relative concepts, and are described with reference to directions indicated in the drawings.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It should be understood that terms such as "comprise", "include" or "have" are intended to specify that a feature, a number, a step, an operation, a component, a part, or a combination thereof described in the specification is present, and do not preclude a possibility of addition or existence of one or more other features or numbers, steps, operations, components, parts, or combinations thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to the accompanying drawings.

Figure 1B:
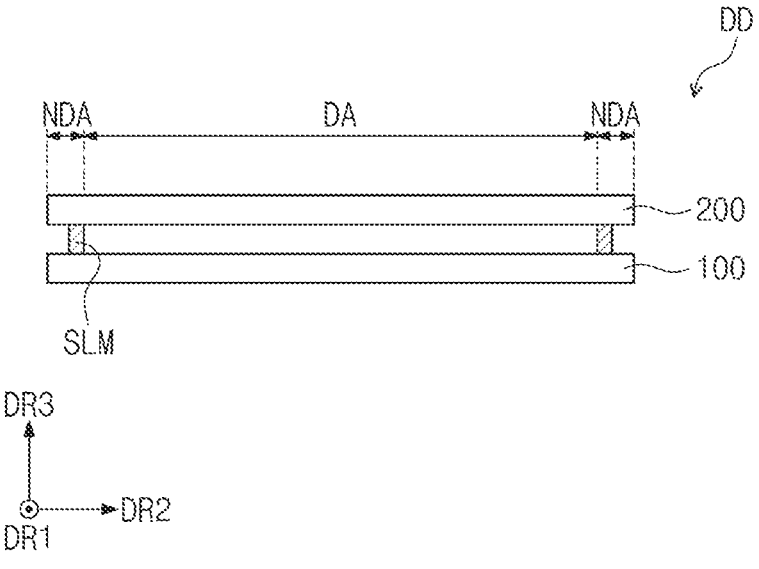
FIG. 1B is a cross-sectional view of a display device according to an embodiment of the disclosure.
Figure 1C:
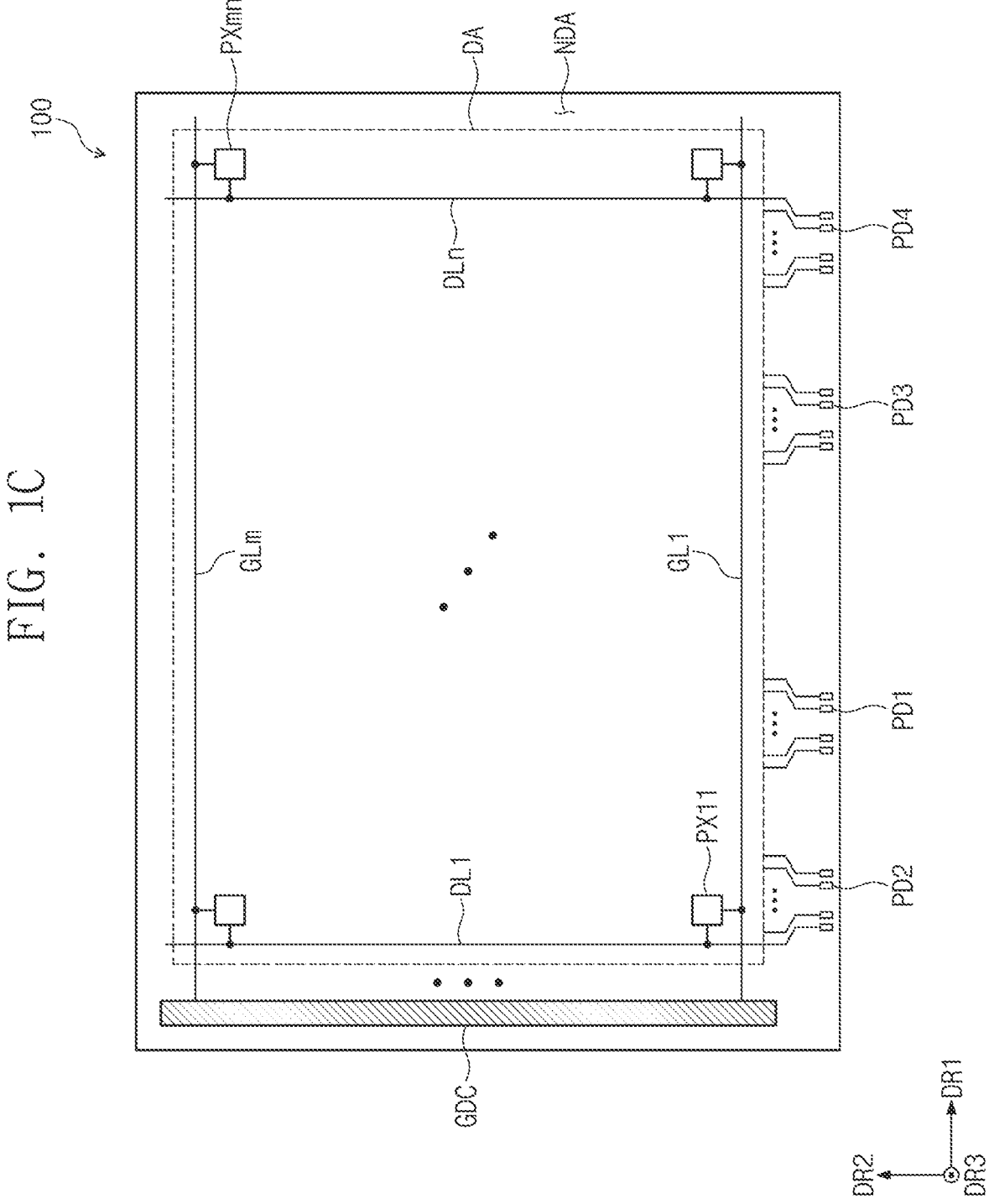
FIG. 1C is a plan view of a display panel according to an embodiment of the disclosure.

FIG. 1A is a perspective view of a display device according to an embodiment of the disclosure. FIG. 1B is a cross-sectional view of a display device according to an embodiment of the disclosure. FIG. 1C is a plan view of a display panel according to an embodiment of the disclosure.

Referring to FIG. 1A, an embodiment of a display device DD may display an image on a display surface DD-IS. The display surface DD-IS is parallel to a plane defined by a first direction DR1 and a second direction DR2. An upper surface of a member constituting the uppermost portion of the display device DD may be defined as the display surface DD-IS.

A normal direction to the display surface DD-IS, that is, a thickness direction of the display device DD is indicated by a third direction DR3. A front surface (or upper surface) of each layer or unit as described below and a back surface (or lower surface) are distinguished from each other based on the third direction DR3.

The display device DD may include a display area DA and a non-display area NDA. Unit pixels PXU are disposed in the display area DA, and the unit pixels PXU are not disposed in the non-display area NDA. The non-display area NDA is defined along a border of the display surface DD-IS. The non-display area NDA may surround the display area DA. In an embodiment of the disclosure, the non-display area NDA may be omitted or disposed only on one side of the display area DA. Although an embodiment where the display device DD is a flat display device is shown in FIG. 1A by way of example, in an alternative embodiment, the display device DD may have a curved shape, be capable of rolling, or be capable of sliding from a housing.

The unit pixels PXU shown in FIG. 1A may be arranged in a matrix form or define a pixel row and a pixel column. The unit pixel PXU is a minimum repetition unit, and the unit pixel PXU may include at least one pixel. The unit pixel PXU may include a plurality of pixels for providing light of different colors from each other.

Referring to FIG. 1B, an embodiment of the display device DD may include a display panel 100 (or a lower display substrate) and a light conversion panel 200 (or an upper display substrate) disposed opposite to and spaced apart from the display panel 100. A predetermined cell gap may be defined between the display panel 100 and the light conversion panel 200. The cell gap may be maintained by a sealing member SLM combining the display panel 100 and the light conversion panel 200 to each other. The sealing member SLM may include a binder resin and inorganic fillers mixed with the binder resin. The sealing member SLM may further include other additives. The additives may include an amine-based curing agent and a photo-initiator. The additives may further include a silane-based additive and an acrylate-based additive. The sealing member SLM may include an inorganic-based material such as frit.

Referring to FIG. 1B, in each of the display panel 100 and the light conversion panel 200, the display area DA and the non-display area NDA respectively corresponding to the display area DA and the non-display area NDA of the display device DD may be defined. Hereinafter, the display area DA of the display device DD may mean the display area DA of each of the display panel 100 and the light conversion panel 200. The non-display area NDA of the display device DD may mean the non-display area NDA of each of the display panel 100 and the light conversion panel 200.

FIG. 1C shows a planar arrangement relationship of signal lines GL1 to GLn, and DL1 to DLm and pixels PX11 to PXmn. The signal lines GL1 to GLn and DL1 to DLm may include a plurality of gate lines GL1 to GLn and a plurality of data lines DL1 to DLm. Here, n and m are natural numbers.

Each of the pixels PX11 to PXmn is connected to a corresponding gate line among the plurality of gate lines GL1 to GLn and a corresponding data line among the plurality of data lines DL1 to DLm. Each of the pixels PX11 to PXmn may include a pixel driver circuit and a light-emitting element. Depending on a configuration of the pixel driver circuit of each of the pixels PX11 to PXmn, other types of signal lines may be further provided in the display panel 100.

A gate driver circuit GDC may be integrated into the display panel 100 using an oxide silicon gate (OSG) driver circuit process or an amorphous silicon gate (ASG) driver circuit process. The gate driver circuit GDC connected to the gate lines GL1 to GLn is disposed at one side in the first direction DR1 of the non-display area NDA. Display pads PD1, PD2, PD3, and PD4 connected to ends of the plurality of data lines DL1 to DLm are disposed at one side in the second direction DR2 of the non-display area NDA.

Figure 2:
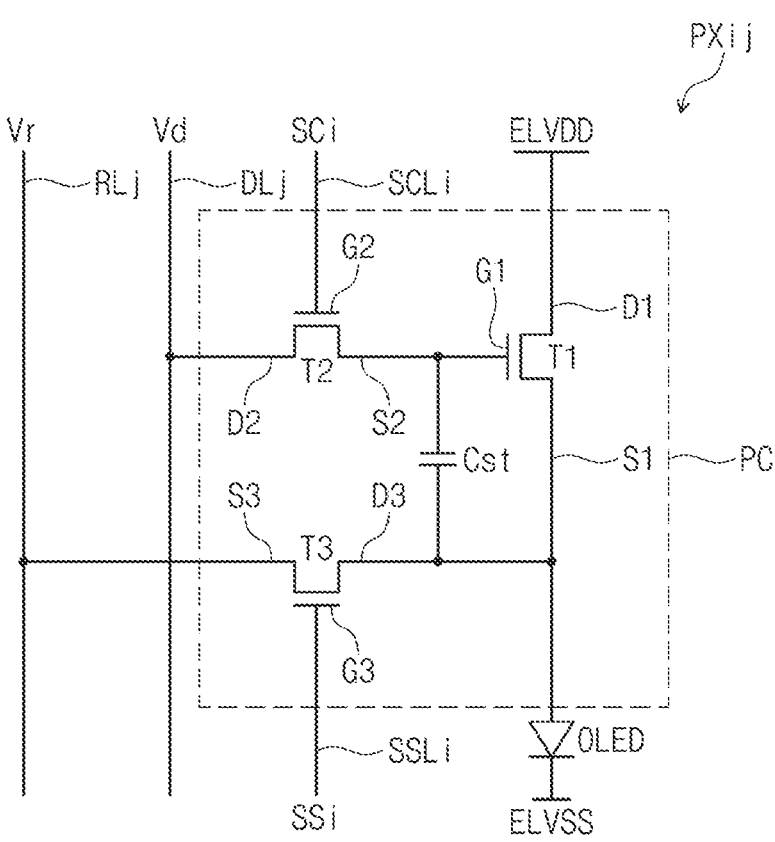
FIG. 2 is an equivalent circuit diagram of a pixel according to an embodiment of the disclosure.

FIG. 2 is an equivalent circuit diagram of a pixel according to an embodiment of the disclosure.

FIG. 2 illustrates a pixel PXij connected to an i-th scan line SCLi, an i-th sensing line SSLi, an j-th data line DLj, and an j-th reference line RLj by way of example. Here, i is a natural number less than or equal to n, and j is a natural number less than or equal to m. The pixel PXij includes a pixel circuit PC and a light-emitting element OLED connected to the pixel circuit PC. The pixel circuit PC may include a plurality of transistors T1 to T3 and a capacitor Cst. Each of the plurality of transistors T1 to T3 may be formed using a low temperature polycrystalline silicon (LTPS) process or a low temperature polycrystalline oxide (LTPO) process. Hereinafter, an embodiment in which each of the plurality of transistors T1 to T3 is embodied as an N-type transistor is described. In an alternative embodiment, at least one transistor of the pixel PXij may be implemented as a P-type transistor.

In an embodiment, as shown in FIG. 2, the pixel circuit PC includes the first transistor T1 (or a driving transistor), the second transistor T2 (or a switch transistor), the third transistor T3 (or a sensing transistor), and the capacitor Cst. However, the pixel circuit PC is not limited to this configuration. Alternatively, the pixel circuit PC may include an additional transistor or an additional capacitor.

The light-emitting element OLED may be an organic light-emitting element or an inorganic light-emitting element including an anode (a first electrode) and a cathode (a second electrode). The anode of the light-emitting element OLED may receive a first voltage ELVDD via the first transistor T1, and the cathode of the light-emitting element OLED may receive a second voltage ELVSS. The light-emitting element OLED may receive the first voltage ELVDD and the second voltage ELVSS to emit light.

The first transistor T1 may include a drain D1 that receives the first voltage ELVDD, a source S1 connected to the anode of the light-emitting element OLED, and a gate G1 connected to the capacitor Cst. The first transistor T1 may control a driving current flowing from the first voltage ELVDD to the light-emitting element OLED in response to a voltage value stored in the capacitor Cst.

The second transistor T2 may include a drain D2 connected to the j-th data line DLj, a source S2 connected to the capacitor Cst, and a gate G2 receiving an i-th first scan signal SCi. The j-th data line DLj may receive a data voltage Vd. The second transistor T2 provides the data voltage Vd to the first transistor T1 in response to the i-th first scan signal SCi.

The third transistor T3 may include a source S3 connected to the j-th reference line RLj, a drain D3 connected to the anode of the light-emitting element OLED, and a gate G3 that receives an i-th second scan signal SSi. The j-th reference line RLj may receive a reference voltage Vr. The third transistor T3 may initialize the capacitor Cst and the anode of the light-emitting element OLED.

The capacitor Cst stores therein a voltage corresponding to a difference between a voltage received from the second transistor T2 and the first voltage ELVDD. The capacitor Cst may be connected to the gate G1 of the first transistor T1 and the anode of the light-emitting element OLED.

Figure 3A:
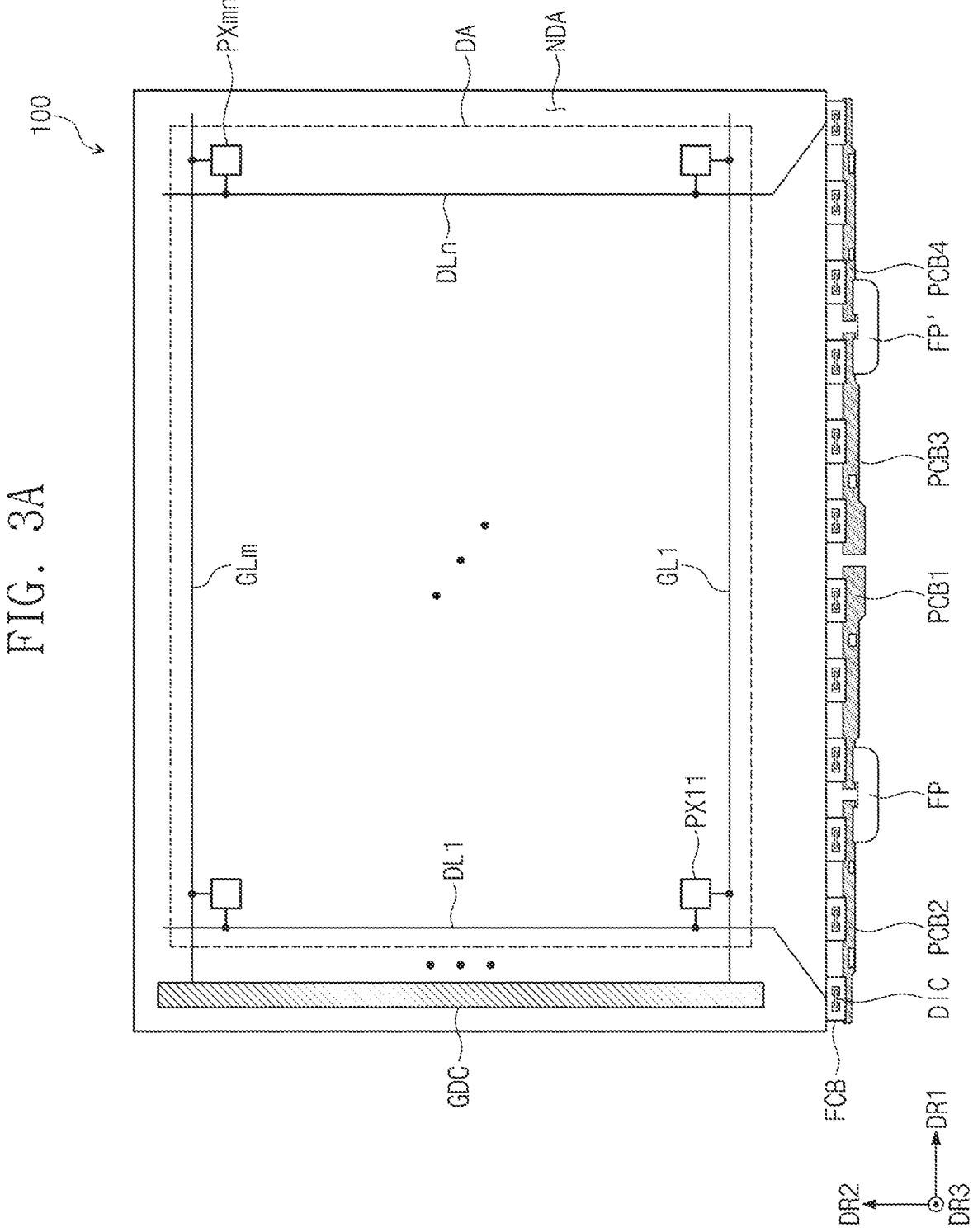
Figure 3B:
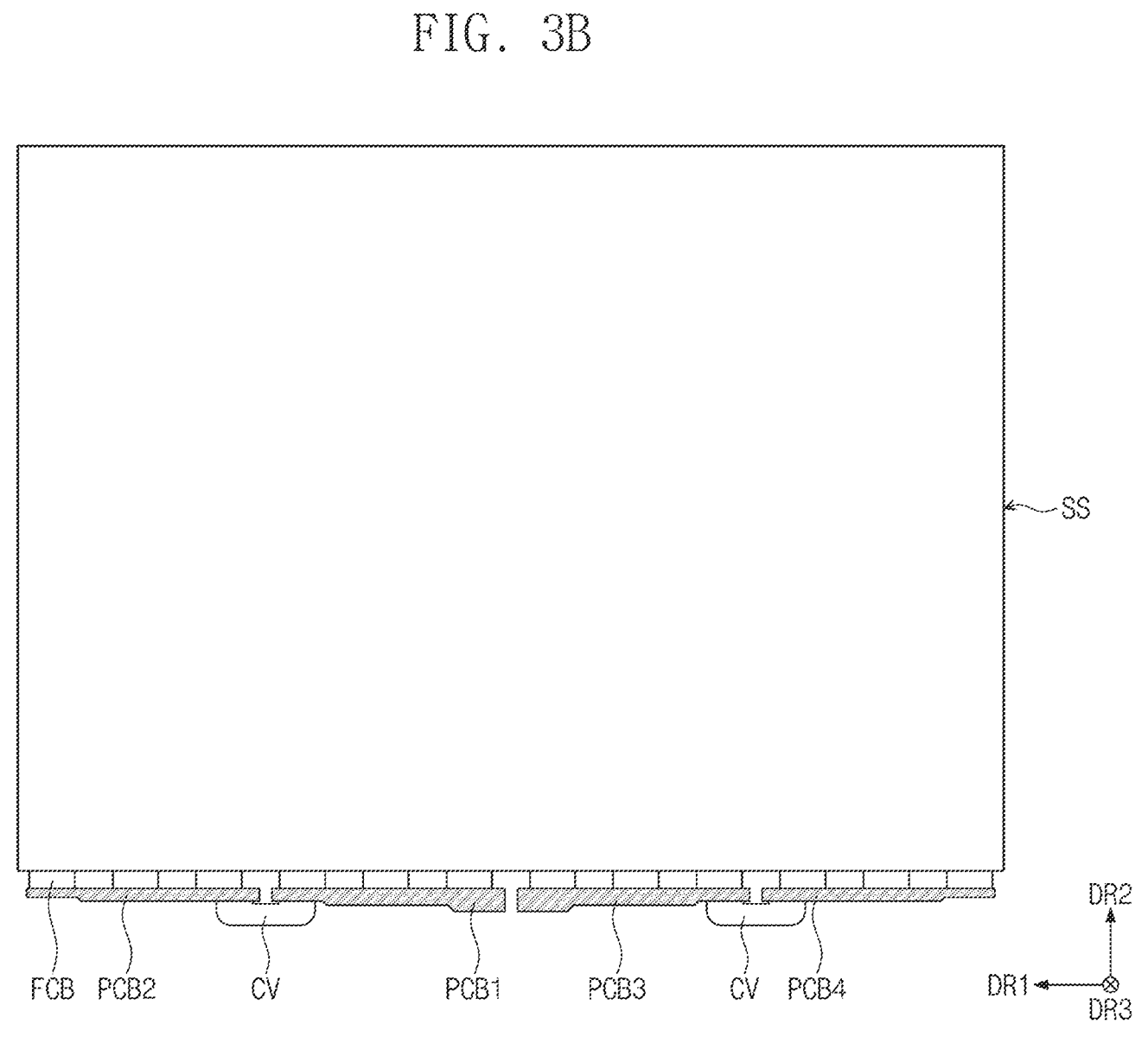
Figure 3C:
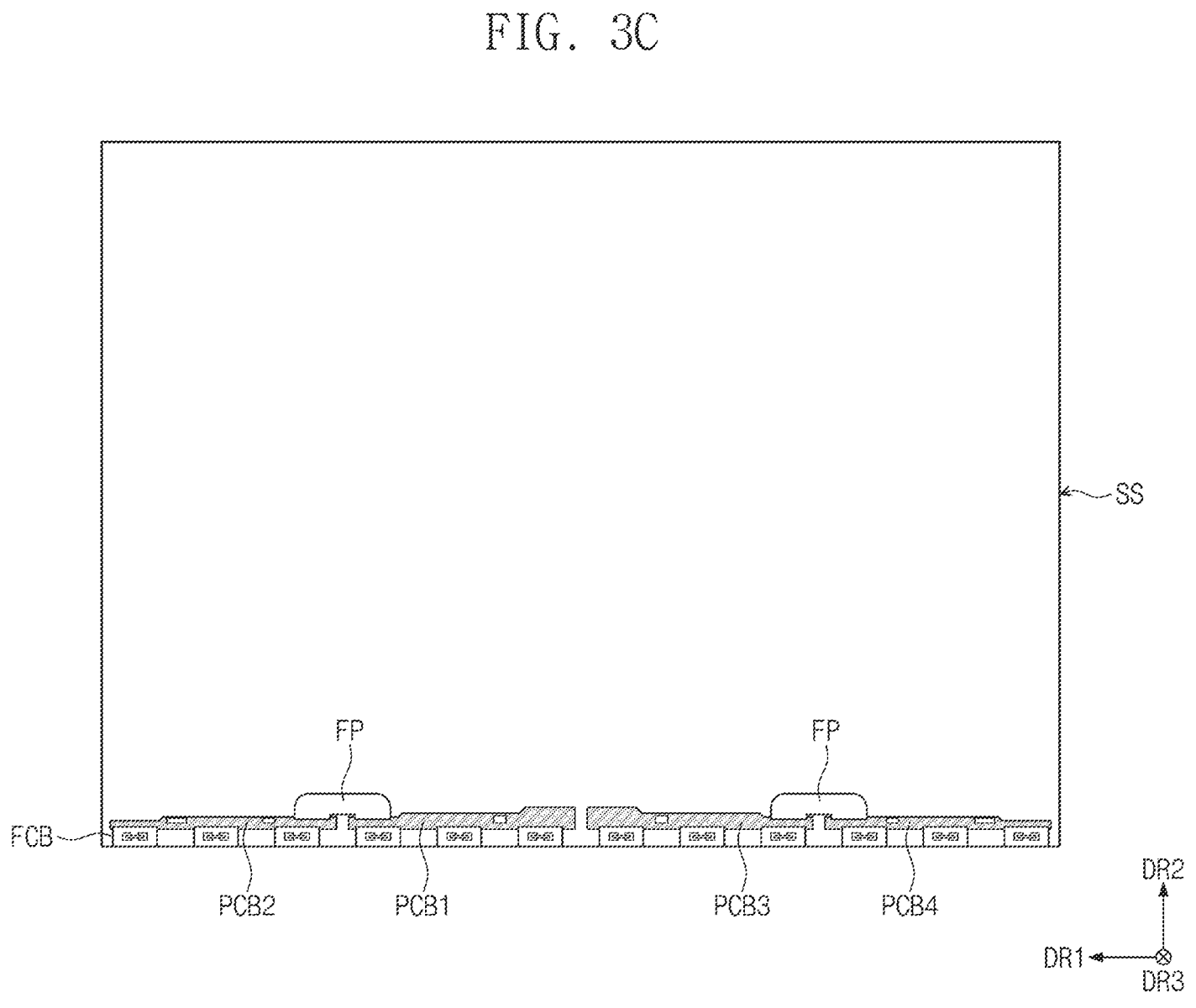

FIG. 3A to FIG. 3C are plan views of a display device according to an embodiment of the disclosure. Specifically, FIG. 3A is a plan view of the display device as viewed in the third direction DR3, FIG. 3B is a plan view of the display device as viewed in an opposite direction to the third direction DR3, and FIG. 3C is a plan view of the display device as viewed in the opposite direction to the third direction DR3 in a state where a flexible film FCB is bent.

Referring to FIG. 3A to FIG. 3C, the display device according to an embodiment of the disclosure may include the display panel 100, a lower member SS, a plurality of circuit boards PCB1, PCB2, PCB3, and PCB4, a plurality of flexible films FCB, a connection film FP, and a circuit film FCB. In an embodiment, as shown in FIG. 3A to FIG. 3C, the connection film FP may be provided in plural. In an alternative embodiment, the display device may include a single connection film FP.

The display panel 100 may include a plurality of pixels and a plurality of display pads connected to the pixels. As described above, the plurality of pixels may be disposed in the display area DA, and the plurality of display pads may be disposed in the non-display area NDA.

The display panel 100 according to an embodiment of the disclosure may be the aforementioned display panel 100. However, the disclosure is not limited thereto, and the display panel 100 according to an embodiment of the disclosure may be embodied in various forms such as a liquid crystal display panel, a plasma display panel, and an electrophoretic display panel.

The plurality of display pads according to an embodiment of the disclosure may be disposed on the display panel 100 and spaced apart from each other along the first direction DR1. In an embodiment, as shown in FIG. 1C, the first display pad PD1 may be spaced apart from each of the second display pad PD2 and the third display pad PD3 in the first direction DR1. The third display pad PD3 may be spaced apart from each of the first display pad PD1 and the fourth display pad PD4 in the first direction DR1. However, the disclosure is not limited to what is shown in the figure, and the plurality of display pads may be spaced apart from each other along the second direction DR2. The disclosure is not limited to any one embodiment.

The lower member SS may be disposed under the display panel. The lower member SS may include a support member for supporting the display panel 100. The lower member SS may supplement rigidity of the display panel 100.

The circuit boards may include a first circuit board PCB1, a second circuit board PCB2, a third circuit board PCB3, and a fourth circuit board PCB4.

The first to fourth circuit boards PCB1, PCB2, PCB3, and PCB4 may be attached to one side of the display panel 100. The first to fourth circuit boards PCB1, PCB2, PCB3, and PCB4 may be electrically connected to circuits of the display panel 100. The first to fourth circuit boards PCB1, PCB2, PCB3, and PCB4 may be spaced apart from each other. In an embodiment, the first to fourth circuit boards may be disposed along one side extending along the first direction DR1 of the display panel 100 and may be spaced apart from each other along the first direction DR1.

In an embodiment, as shown in FIG. 3A, the first circuit board PCB1, the second circuit board PCB2, the third circuit board PCB3, and the fourth circuit board PCB4 may be spaced apart from the display panel 100 in the second direction DR2. In such an embodiment, the first to fourth circuit boards PCB1, PCB2, PCB3, and PCB4 may be spaced apart from each other along the first direction DR1.

The disclosure is not limited thereto. In an embodiment, the first circuit board PCB1, the second circuit board PCB2, the third circuit board PCB3, and the fourth circuit board PCB4 may be spaced apart from the display panel in a direction different from the second direction DR2. In an embodiment, the first to fourth circuit boards PCB1, PCB2, PCB3, and PCB4 may be spaced from each other in a direction different from the first direction DR1.

FIG. 3A to FIG. 3C show an embodiment where the four circuit boards are disposed on one side of the display panel 100 by way of example. The number or arrangement of the circuit boards may be variously changed according to a design of the display panel 100, such as resolution of the display panel 100, a size of the display panel 100, and a specification of a driver circuit DIC. The disclosure is not limited to any one embodiment.

The first to fourth circuit boards PCB1, PCB2, PCB3, and PCB4 may be electrically connected to the display panel 100 via the circuit films FCB. One circuit board may be connected thereto via at least one circuit film. In an embodiment, as shown in FIG. 3A to 3C, each of the first to fourth circuit boards PCB1, PCB2, PCB3, and PCB4 is connected to three circuit films FCB. However, this is illustratively shown. The number of circuit films may be variously changed according to the design of the display panel 100. The disclosure is not limited to any one embodiment.

One side of each of the circuit films FCB may be connected to the display panel 100, and another side (or an opposing side) thereof may be connected to the first to fourth circuit boards PCB1, PCB2, PCB3, and PCB4. Each of the circuit films FCB may be embodied as a flexible film.

In an embodiment, each of the circuit films FCB may include the driver circuit DIC. The driver circuit DIC may be provided in a form of a chip and may be mounted on the circuit film FCB. That is, each of the circuit films FCB may be embodied in a chip-on film form. The driver circuit DIC may include, for example, a data driver circuit. However, the disclosure is not limited thereto. Alternatively, in each of the circuit films FCB, the driver circuit may be omitted. In such an embodiment, the driver circuit may be mounted on the display panel 100 or each of the circuit boards PCB1, PCB2, PCB3, and PCB4, and each of the flexible films FCB may be a film including a plurality of wirings.

A controller may be mounted on each of the first to fourth circuit boards PCB1, PCB2, PCB3, and PCB4. The controller may receive a control signal, image data, and external power. Therefore, each of the first to fourth circuit boards PCB1, PCB2, PCB3, and PCB4 may include a pad electrically connected to the display panel 100. One pad is connected to a corresponding display pad among the display pads of the display panel 100 via the connection film. In an embodiment, for example, the pad of the circuit board may be directly connected to the display pad of the display panel 100. In such an embodiment, at least a portion of the circuit board may be bent, and the circuit film may be omitted.

In an embodiment, the first circuit board PCB1 may include a first pad (SPD1 of FIG. 4A) electrically connected to the first display pad (PD1 of FIG. 1C) among the display pads. The second circuit board PCB2 may include a second pad (SPD2 of FIG. 4A) electrically connected to the second display pad (PD2 of FIG. 1C) among the display pads. The third circuit board PCB3 may include a third pad electrically connected to the third display pad (PD3 of FIG. 1C) among the display pads. The fourth circuit board PCB4 may include a fourth pad electrically connected to the fourth display pad (PD4 of FIG. 1C) among the display pads. Each of the first pad (SPD1 of FIG. 4A), the second pad (SPD2 of FIG. 4B), the third pad, and the fourth pad may be connected to each of the first display pad (PD1 of FIG. 1C), the second display pad (PD2 of FIG. 1C), the third display pad (PD3 of FIG. 1C) and the fourth display pad (PD4 of FIG. 1C) via a wiring. The disclosure is not limited thereto, and the first pad (SPD1 of FIG. 4A), the second pad (SPD2 of FIG. 4B), the third pad, and the fourth pad may directly contact the first display pad (PD1 of FIG. 1C), the second display pad (PD2 of FIG. 1C), the third display pad (PD3 of FIG. 1C) and the fourth display pad (PD4 of FIG. 1C), respectively.

The connection film FP electrically connects two different adjacent circuit boards to each other. The connection film FP may be a flexible film. In an embodiment, the connection film FP may include a base film and at least one wiring disposed thereon. In an embodiment, for example, the connection film FP may connect the first circuit board PCB1 and the second circuit board PCB2 to each other. In such an embodiment, the connection film FP may connect the third circuit board PCB3 and the fourth circuit board PCB4 to each other. The connection film FP may connect the first circuit board PCB1 and the second circuit board PCB2 to each other or may connect the third circuit board PCB3 and the fourth circuit board PCB4 to each other to transfer a signal from one circuit board to another circuit board. In an embodiment, for example, the connection film FP may transfer the signal output from the first circuit board PCB1 to the second circuit board PCB2.

The connection film FP connecting the first circuit board PCB1 and the second circuit board PCB2 to each other and the connection film FP connecting the third circuit board PCB3 and the fourth circuit board PCB4 to each other may perform substantially the same function as each other. Hereinafter, for convenience of description, the connection film FP connecting the first circuit board PCB1 and the second circuit board PCB2 to each other will be mainly described. Features of the connection film FP connecting the first circuit board PCB1 and the second circuit board PCB2 to each other may be equally applied to the connection film FP connecting the third circuit board PCB3 and the fourth circuit board PCB4 to each other.

A portion of the connection film FP may be coplanar with the first circuit board PCB1 and the second circuit board PCB2.

The display device may include a cover CV. The cover CV may be disposed on the connection film FP, and may be integrally formed with the connection film FP.

The circuit film FCB may be provided as a flexible film. In an embodiment, the first circuit board PCB1, the second circuit board PCB2, and the connection film FP may be disposed along a side surface of the display panel 100 or on the back surface thereof.

FIG. 3A and FIG. 3B show a state in which the circuit films FCB are not bent, and a state in which the first circuit board PCB1, the second circuit board PCB2, and the connection film FP are disposed along the side surface of the display panel 100.

FIG. 3C shows a state in which the circuit film FCB is bent, and a state in which the first circuit board PCB1, the second circuit board PCB2, and the connection film FP are disposed on the back surface of the display panel 100. Alternatively, the first circuit board PCB1, the second circuit board PCB2, and the connection film FP may be disposed on the lower member SS. In an embodiment, the lower member SS may be positioned between the connection film FP and the display panel 100.

When the circuit film FCB is bent as shown in FIG. 3C, the cover CV may prevent the foreign material from flowing into a space between the first circuit board PCB1 and the connection film FP.

Figure 4A:
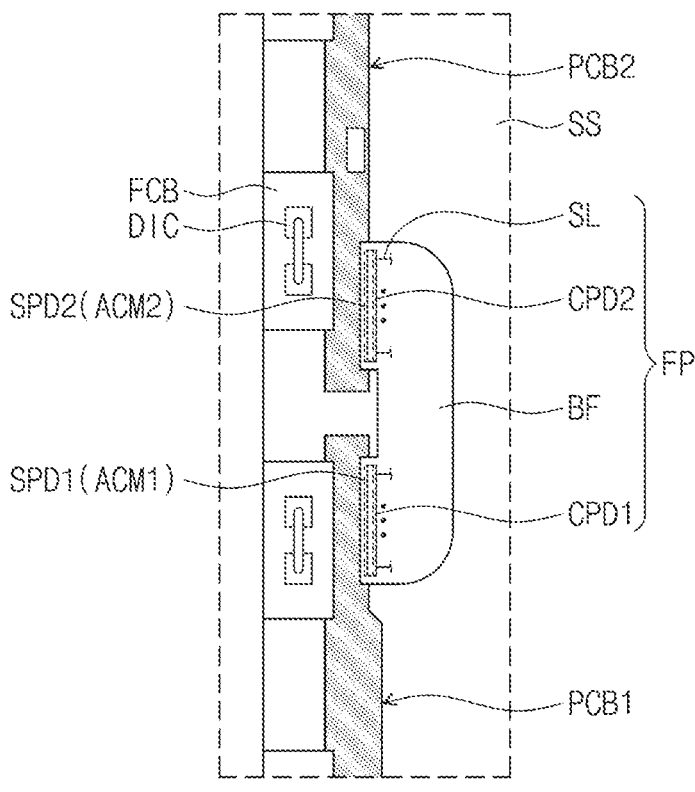
FIG. 4A is an enlarged view of a portion of FIG. 3B.
Figure 4A:
Figure 4B:
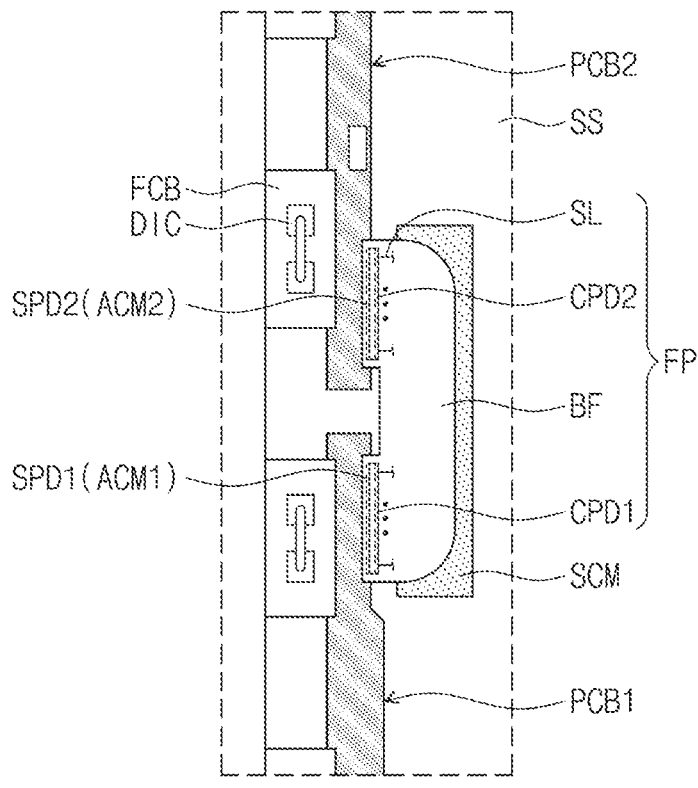
FIG. 4B is an enlarged view showing another embodiment of FIG. 4A.
Figure 4B:
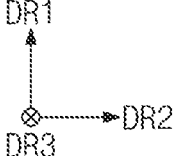

FIG. 4A and FIG. 4B are plan views showing a portion of the display device. FIG. 4A and FIG. 4B show the same areas in different embodiments, respectively. FIG. 4A is an enlarged view of a portion of FIG. 3C, and FIG. 4B is an enlarged view showing an alternative embodiment of FIG. 4A.

That is, FIG. 4A and FIG. 4B show the first circuit board PCB1, the second circuit board PCB2, and the connection film FP positioned on the lower member SS in a state where the flexible films FCB are bent.

The connection film FP may include a base film BF, a first connection pad CPD1, a second connection pad CPD2, and a signal line SL. The first connection pad CPD1 is disposed on a front surface of the base film BF and is electrically connected to the first circuit board PCB1. In an embodiment, for example, the first connection pad CPD1 may be connected to the first pad SPD1 of the first circuit board PCB1. The second connection pad CPD2 is disposed on the front surface of the base film BF and is electrically connected to the second circuit board PCB2. In an embodiment, for example, the second connection pad CPD2 may be connected to the second pad SPD2 of the second circuit board PCB2. The signal line SL may connect the first connection pad CPD1 and the second connection pad CPD2 to each other.

Referring to FIGS. 4A and 4B, in an embodiment, the base film BF may extend along the second direction DR2, and at least a portion of the base film BF may be bent. in an embodiment, the base film BF may have a shape bent along an arrangement direction of two adjacent circuit boards PCB1 and PCB2. In a plan view on a plane defined by the first direction DR1 and the second direction DR2 (or when viewed in the third direction DR3), the base film BF may have a shape including a first side on which the first connection pad CPD1 is provided and which overlaps and is connected to the first circuit board PCB1, a second side on which the second connection pad CPD2 is provided, and which overlaps and is connected to the second circuit board PCB2, a first curved side connecting the first side and the second side to each other, and a second curved side connecting the first side and the second side to each other and opposite to the first curved side.

The first connection pad CPD1 and the second connection pad CPD2 may be arranged along the first direction DR1. The signal line SL connecting the first connection pad CPD1 and the second connection pad CPD2 to each other may extend via a bent portion of the base film and have a curved line shape in the plan view.

The first connection pad CPD1 and the second connection pad CPD2 are disposed on the front surface of the base film BF. The front surface of the base film BF may face the lower member SS. That is, a surface of the connection film seen in a view of each of FIGS. 4A and 4B may be the back surface of the base film BF.

The first connection pad CPD1 and the second connection pad CPD2 may be positioned between the base film BF and the lower member SS, and may be specifically disposed on a surface of the base film BF facing toward the third direction DR3. The first connection pad CPD1 and the second connection pad CPD2 may be disposed on one side and the other side of the base film BF, and the first connection pad CPD1 and the second connection pad CPD2 may be spaced apart from each other along the first direction DR1.

Each of the first pad SPD1 and the second pad SPD2 may be disposed on a surface of each of the first circuit board PCB1 and the second circuit board PCB2 facing toward a direction opposite to the third direction DR3.

In FIG. 4A and FIG. 4B, the first connection pad CPD1 and the second connection pad CPD2, and the first pad SPD1 and the second pad SPD2 are schematically illustrated. Referring to FIG. 4A and FIG. 4B, the first connection pad CPD1 and the first pad SPD1 may be electrically connected to each other while directly contacting each other. The second connection pad CPD2 and the second pad SPD2 may be electrically connected to each other while directly contacting each other. However, the disclosure is not limited thereto, and a first adhesive member ACM1 may be provided between the first connection pad CPD1 and the first pad SPD1, and a second adhesive member ACM2 may be provided between the second connection pad CPD2 and the second pad SPD2. The disclosure is not limited to any one embodiment.

The first adhesive member ACM1 or the second adhesive member ACM2 may include a conductive film. In an embodiment, for example, the first adhesive member ACM1 or the second adhesive member ACM2 may include an anisotropic conductive film (ACF). The disclosure is not limited thereto. The first adhesive member ACM1 or the second adhesive member ACM2 may include a conventional conductive adhesive or a pressure-sensitive adhesive.

Although not shown in the drawing, the connection film FP connecting the third circuit board (PCB3 of FIG. 3A) and the fourth circuit board (PCB4 of FIG. 3A) to each other may include the base film BF, the first connection pad CPD1, the second connection pad CPD2, the signal line SL. The first connection pad CPD1 of the connection film FP connecting the third circuit board (PCB3 of FIG. 3A) and the fourth circuit board (PCB4 of FIG. 3A) to each other may be electrically connected to the third pad of the third circuit board (PCB3 of FIG. 3A). The second connection pad CPD2 of the connection film FP connecting the third circuit board (PCB3 of FIG. 3A) and the fourth circuit board (PCB4 of FIG. 3A) to each other may be electrically connected to the fourth pad of the fourth circuit board (PCB4 of FIG. 3A). The signal line SL may connect the first connection pad CPD1 and the second connection pad CPD2 to each other. In such an embodiment, the connection film FP connecting the third circuit board (PCB3 of FIG. 3A) and the fourth circuit board (PCB4 of FIG. 3A) to each other may have substantially the same arrangement relationship as that of the connection film FP connecting the first circuit board PCB1 and the second circuit board PCB2 to each other, and may perform substantially the same function as a function of the connection film FP connecting the first circuit board PCB1 and the second circuit board PCB2 to each other.

Figure 6A:
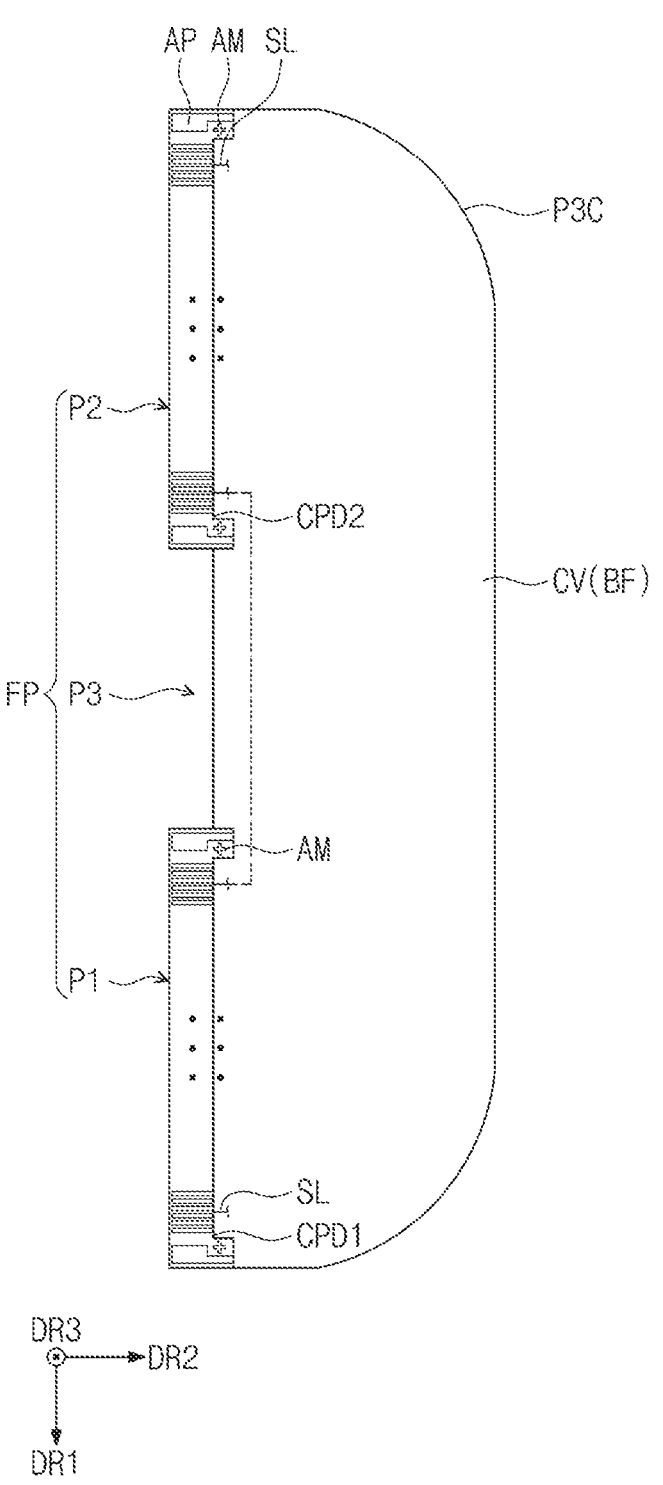
FIG. 6A is a plan view of a connection film according to an embodiment of the disclosure.

In an embodiment, the connection film FP may further include an alignment mark (AM of FIG. 6A). The alignment mark AM may prevent misalignment between the connection film FP and the first circuit board PCB1 and the second circuit board PCB2. In an embodiment, the alignment mark AM may prevent misalignment of the connection film FP with other components such as the display panel 100 and the lower member SS. The alignment mark AM will be described in detail later. In an alternative embodiment, the alignment mark AM may be omitted.

Referring to FIG. 4B, the display device according to an embodiment of the disclosure may include a securing member SCM interposed between the connection film FP and the display panel (100 of FIG. 3A).

According to an embodiment, the securing member SCM may be interposed between the cover CV disposed on the front surface of the base film BF and the back surface of the display panel (100 of FIG. 3A). According to an alternative embodiment, the securing member SCM may be interposed between the cover CV disposed on the front surface of the base film BF and the lower member SS disposed on the back surface of display panel (100 of FIG. 3A).

In such an embodiment, the securing member SCM may be disposed on a surface of the base film BF facing toward the third direction DR3, and may be disposed on a surface of the display panel (100 of FIG. 3A) facing toward the direction opposite to the third direction DR3.

According to an embodiment, the securing member SCM may include an adhesive material, thereby fixing the lower member SS and the connection film FP to each other.

In such an embodiment, the securing member SCM may secure the lower member SS and the connection film FP to each other, thereby effectively preventing the foreign material from flowing into a space between the lower member SS and the connection film FP. Thus, the foreign material may be effectively prevented from flowing into a space (SP of FIG. 5B) which will be described later.

Figure 5A:
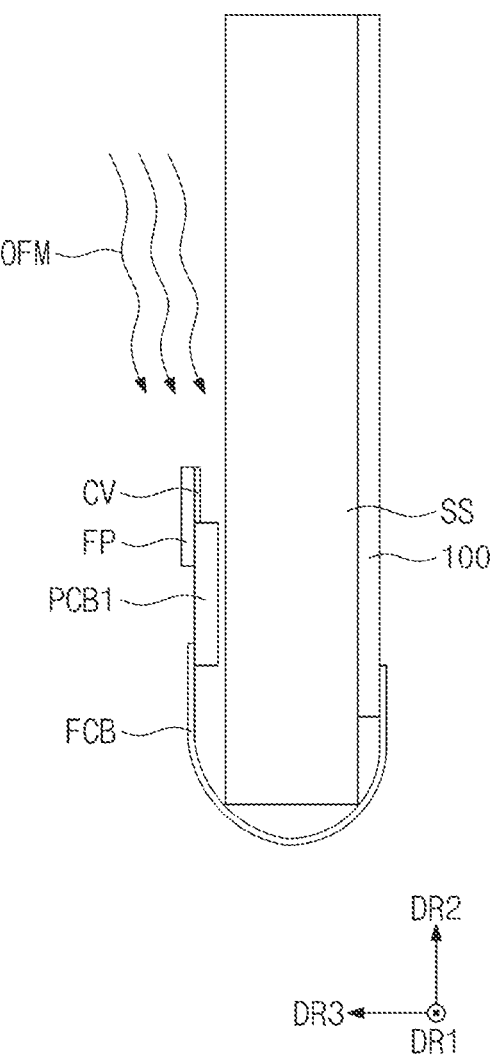
FIG. 5A is a cross-sectional view of a display device according to an embodiment of the disclosure.
Figure 5B:
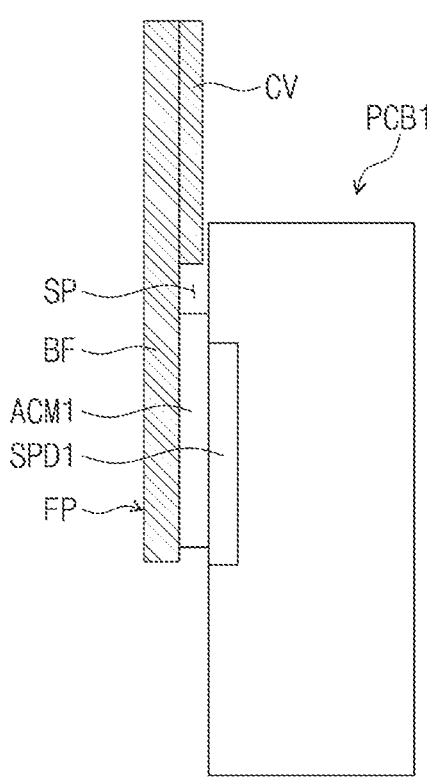
FIG. 5B is an enlarged view of a portion of FIG. 5A.

FIG. 5A is a cross-sectional view of a display device according to an embodiment of the disclosure as cut in a direction parallel to the third direction DR3, and FIG. 5B is an enlarged view of a portion of FIG. 5A. FIG. 5A and FIG. 5B show a positional relationship between the display panel 100, the lower member SS, the first circuit board PCB1, and the connection film FP.

For convenience of illustration and description, hereinafter, only a relationship between the first circuit board PCB1 and the connection film FP is illustrated in the drawing and is described. However, the illustration and description as set forth below may also be applied to a relationship between the second circuit board (PCB2 of FIG. 4A) and the connection film FP.

Referring to FIGS. 5A and 5B, in the display device according to an embodiment of the disclosure, the lower member SS may be positioned on a surface of the display panel 100 facing toward the third direction DR3.

The first circuit board may be positioned on a surface of the lower member SS facing toward the third direction DR3. The connection film FP may be positioned on a surface of the first circuit board facing toward the third direction DR3.

The cover CV may be positioned on a surface of the connection film FP facing toward the opposite direction to the third direction DR3.

The flexible film FCB may be bent from one edge of the display panel 100. In one example, one end of the flexible film FCB may be positioned on the front surface of the display panel 100, and another end (or an opposing end) of the flexible film FCB may be positioned on the back surface of the display panel 100. In an embodiment, one end of the flexible film FCB may be connected to the display panel 100, and the opposing end of the flexible film FCB may be connected to the first circuit board PCB1.

The foreign material OFM may flow into a space SP between the cover CV and the lower member SS, and may further flow into the space SP between the cover CV and the first circuit board PCB1. When the foreign material flows into the space SP between the cover CV and the first circuit board PCB1, an electrical short circuit between the connection pad of the connection film FP and the first pad SPD1 of the first circuit board PCB1 may occur due to the foreign material. Thus, overcurrent may occur, and a defect of the display device may occur.

As shown in the drawing, the cover CV may substantially contact the first circuit board PCB1. "Substantially contacting" means including a case when the cover CV and the first circuit board PCB1 are spaced from each other by a predetermined distance due to a force applied to the cover CV or the first circuit board PCB1, for example, gravity.

The connection film FP and the first circuit board PCB1 may be bonded to each other via the first adhesive member ACM1. The first adhesive member ACM1 may partially overlap the first connection pad CPD1 disposed on the front surface of the base film BF. Further, the first adhesive member ACM1 may partially overlap the first pad SPD1 of the first circuit board PCB1.

The first adhesive member ACM1 may not overlap the cover CV in a plan view. However, the disclosure is not limited to what is shown in the drawing, and the cover CV and the first adhesive member ACM1 may only partially overlap each other in a plan view.

The space SP may be defined between the first circuit board PCB1 and the connection film FP. A size of the space SP depends on a design condition of the display device such as a size and a position of each of components thereof. However, the disclosure is not limited to any one embodiment. As shown in the drawing, the space SP and the cover CV or the adhesive member may not overlap each other. However, the disclosure is not limited thereto, and the space SP and the cover CV or the adhesive member may partially overlap each other.

The cover CV may be spaced from the first circuit board PCB1 by a predetermined distance. However, the disclosure is not limited to what is shown in the drawing, and the cover CV and the first circuit board PCB1 may be in contact with each other. In an embodiment where the cover CV and the first circuit board PCB1 are in contact with each other, the external foreign material OFM may not flow into the space SP.

In the display device according to an embodiment of the disclosure, as shown in the drawing, the connection film FP and the first circuit board PCB1 may be in contact with each other via an adhesive member. However, the disclosure is not limited thereto, and the connection film FP and the first circuit board PCB1 may be in direct contact with each other. The disclosure is not limited to any one embodiment.

FIG. 6A is a plan view of the connection film FP according to an embodiment of the disclosure.

Referring to FIG. 6A, the connection film FP according to an embodiment of the disclosure may include the base film BF, the first connection pad CPD1, the second connection pad CPD2, the signal line SL, and the alignment mark AM.

The first connection pad CPD1 and the second connection pad CPD2 may be disposed on the front surface of the base film BF. The first connection pad CPD1 and the second connection pad CPD2 may be disposed on a surface of the base film BF facing toward the third direction DR3. The signal line SL may electrically connect the first connection pad CPD1 and the second connection pad CPD2 to each other.

The alignment mark AM may be disposed on the front surface of the base film BF. The alignment mark AM may be provided in plural. Some of the plurality of alignment marks AM may be adjacent to the first connection pad CPD1, while the others of the plurality of alignment marks AM may be adjacent to the second connection pad CPD2.

The connection film FP may include an alignment portion AP. The alignment portion AP may be adjacent to the first connection pad CPD1, the second connection pad CPD2, and the alignment mark AM.

According to an embodiment of the disclosure, the first connection pad CPD1 and the second connection pad CPD2 may be spaced apart from each other in the first direction DR1. The first connection pads CPD1 may be arranged in the first direction DR1. The second connection pads CPD2 may be arranged in the first direction DR1.

Some of the plurality of alignment marks AM may be spaced apart from the first connection pad CPD1 in a direction different from the first direction DR1. The others of the plurality of alignment marks AM may be spaced apart from the second connection pad CPD2 in a direction different from the first direction DR1.

The connection film FP according to an embodiment of the disclosure may include a first portion P1, a second portion P2, and a third portion P3. The first portion P1, the second portion P2, and the third portion P3 may be distinguished (or defined separately) from each other.

The first connection pad CPD1 may be disposed in the first portion P1. The second connection pad CPD2 may be disposed in the second portion P2. In the third portion P3, the signal line SL may be disposed. The first portion P1 may overlap the first pad SPD1 of the first circuit board PCB1. The second portion P2 may overlap the second pad SPD2 of the second circuit board PCB2. The third portion P3 may overlap the cover CV.

One alignment mark AM may be disposed in the first portion P1, and another alignment mark AM may be disposed in the second portion P2. The alignment mark AM disposed in the first portion P1 and the first connection pad CPD1 may be spaced apart from each other. The alignment mark AM disposed in the second portion P2 and the second connection pad CPD2 may be spaced apart from each other. Further, the alignment portion AP may be disposed in each of the first portion P1 and the second portion P2.

The first connection pads CPD1 may be arranged in the first direction DR1 while being disposed in the first portion PT. The second connection pads CPD2 may be arranged in the first direction DR1 while being disposed in the second portion P2. The alignment mark AM disposed in the first portion P1 may be spaced apart from the first connection pad CPD1 in a direction different from the first direction DR1. The alignment mark AM disposed in the second portion P2 may be spaced apart from the second connection pad CPD2 in a direction different from the first direction DR1.

The first portion P1 and the second portion P2 may be spaced apart from each other in the first direction DR1, while the third portion P3 may connect the first portion P1 and the second portion P2 to each other.

The third portion P3 may include a bent portion P3C bent along the first direction DR1. That is, the third portion P3 may include the bent portion P3C bent along a direction from the second portion P2 to the first portion P1 or from the first portion P1 to the second portion P2. The signal line SL disposed in the third portion P3 may extend along the bent portion P3C.

The cover CV may be integrally formed with the connection film FP as a single unitary and indivisible part. The cover CV may have an integral structure with the base film BF. The cover CV may include or be made of a same material as that of the base film BF. However, the disclosure is not limited thereto, and the cover CV may be provided separately from the base film BF, or may include or be made of a different material from that thereof. The disclosure is not limited to any one embodiment.

Figure 6B:
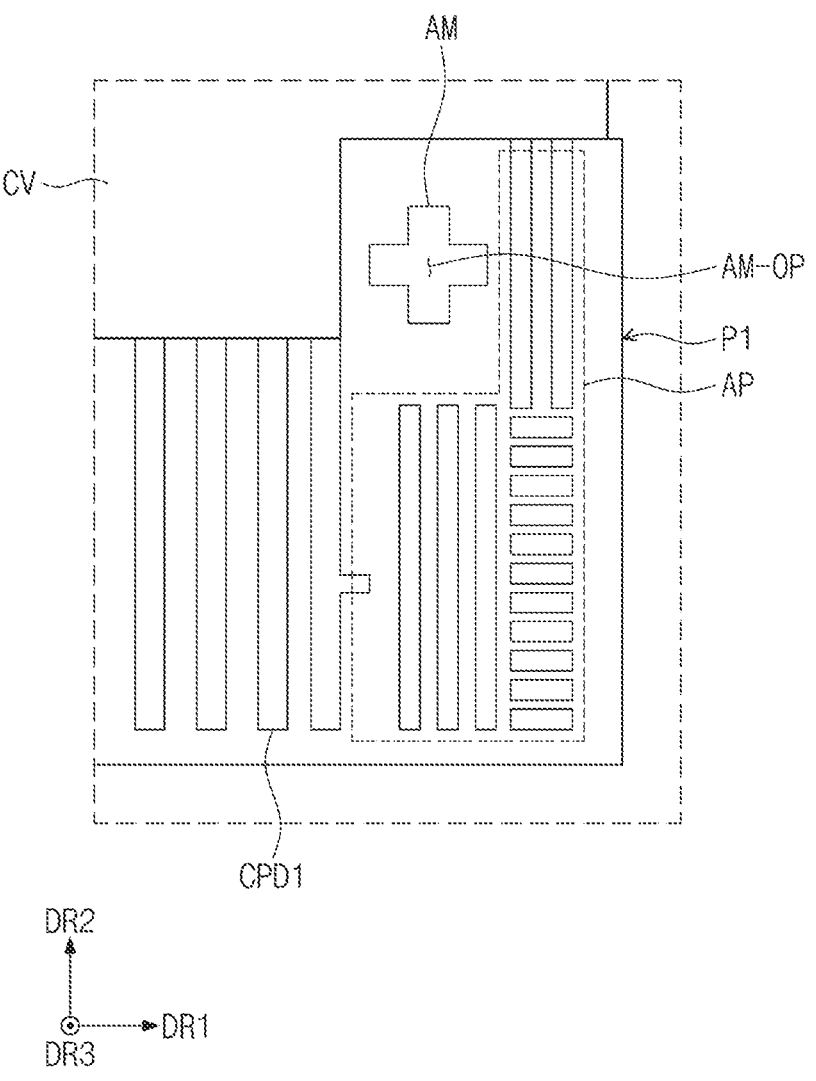
FIG. 6B is an enlarged view of a portion of the connection film of FIG. 6A.

FIG. 6B is an enlarged view of a portion of FIG. 6A. Specifically, FIG. 6B is an enlarged view of a portion of the first portion P1 of FIG. 6A.

Referring to FIG. 6B, in an embodiment, the alignment mark AM and the cover CV may not overlap each other in a plan view. In such an embodiment, the alignment mark AM and the cover CV may be spaced apart from each other in the plan view.

In such an embodiment, the cover CV and the alignment mark AM may be provided not to overlap each other in a plan view, such that the misalignment between the first circuit board PCB1 and the connection film FP occurring due to presence of the cover CV may be effectively prevented. Further, the misalignment between the first circuit board PCB1 and the connection film FP may be effectively prevented. Furthermore, misalignment between each of the first circuit board PCB1 and the second circuit board PCB2 and the connection film FP may be effectively prevented, and misalignment between the components of the display device may be effectively prevented.

According to an embodiment of the disclosure, the alignment mark AM may be embodied as (or defined by) an opening defined through the base film BF. Referring to the drawing, the alignment mark AM may be embodied as an opening AM-OP defined in the first portion P1. That is, the opening AM-OP of the alignment mark AM may be recessed into the first portion P1 in the third direction DR3. Misalignment between the first circuit board PCB1 and the connection film FP may be effectively prevented using the alignment mark AM embodied as the opening and an optical device. However, the disclosure is not limited thereto, and alternatively, the alignment mark AM may be embodied as a recess partially depressed into the first portion P1 of the base film BF, or as a protrusion partially protruding from the first portion P1 of the base film BF.

In an embodiment, as shown in FIG. 6B, the opening AM-OP may have a shape partially extending in the first direction DR1 and the second direction DR2. However, the shape of the opening AM-OP is not limited to that shown in the drawing. The opening AM-OP may partially extend in a direction between the first direction DR1 and the second direction DR2. The disclosure is not limited to any one embodiment.

The first portion PT may include the alignment portion AP. The alignment portion AP may be disposed adjacent to the alignment mark AM. A portion of the alignment portion AP may extend in the first direction DR1, and another portion of the alignment portion AP may extend in the second direction DR2. However, the extension direction of the portion of the alignment portion AP is not limited to the first direction DR1 or the second direction DR2. The portion of the alignment portion AP may extend in a direction different from the first direction DR1 and the second direction DR2.

A portion corresponding to the alignment portion AP may be defined or formed in the first circuit board PCB1. Misalignment between the first circuit board PCB1 and the connection film FP may be effectively prevented based on the alignment portion AP and the portion corresponding to the alignment portion AP. The portion of the alignment portion AP extending in the first direction DR1, the second direction DR2, or in the direction different from the first direction DR1 and the second direction DR2 may allow the misalignment between the first circuit board PCB1 and the connection film FP to be effectively prevented.

The portion of the alignment portion AP may be provided with an opening defined therein to extend through the base film BF as in the above-described alignment mark AM. However, the disclosure is not limited thereto, and alternatively, the portion of the alignment portion AP may be embodied as a protrusion or a recess.

Figure 7:
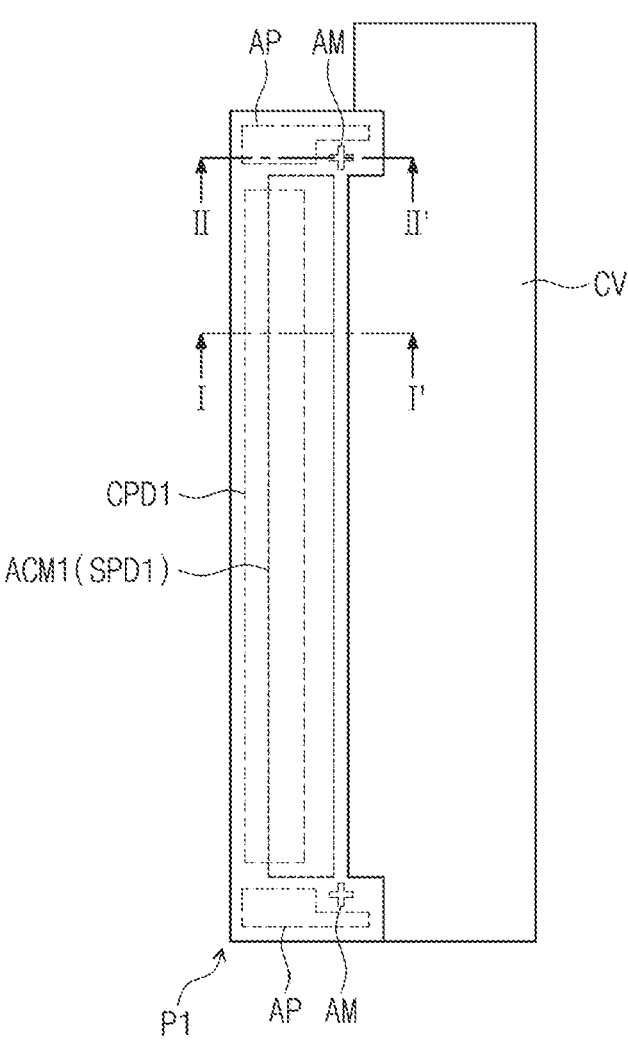
FIG. 7 is an enlarged view of a state in which a circuit board and a connection film overlap each other according to an embodiment of the disclosure.
Figure 7:
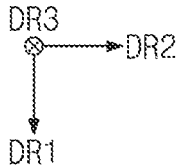

FIG. 7 is an enlarged view of a state in which the circuit board and the connection film FP overlap each other according to an embodiment of the disclosure. Specifically, FIG. 7 is an enlarged view of a portion of the display device in a state in which the first circuit board PCB1, the first adhesive member ACM1, and connection film FP overlap each other.

For convenience of illustration, a state in which the first portion P1 of the connection film FP and the cover CV overlap each other, and the first adhesive member ACM1 and the first connection pad CPD1 overlap each other is shown as the first portion P1 of the connection film FP and the cover CV integrally formed with each other as a single unitary and indivisible part, and the first adhesive member ACM1 and the first pad SPD1 integrally formed with each other as a single unitary and indivisible part. In FIG. 7, the first circuit board (PCB1 in FIG. 4A) is omitted for convenience of illustration.

Referring to FIG. 7, the first adhesive member ACM1 (or the first pad SPD1) and the first connection pad CPD1 may partially overlap each other. The alignment mark AM may be spaced apart from the first adhesive member ACM1 in the first direction DR1 or in a direction different from the first direction DR1. Further, the alignment mark AM may be spaced apart from the cover CV in the first direction DR1 or in a direction different from the first direction DR1. The alignment mark AM may be spaced apart from the first adhesive member ACM1 and the cover CV in a plan view. Alternatively, the alignment mark AM may not overlap the first adhesive member ACM1 and the cover CV in a plan view.

In an embodiment, the alignment mark AM may not overlap the first adhesive member ACM1 and the cover CV in a plan view to align the first circuit board PCB1 and the connection film FP with each other, such that misalignment between the first circuit board (PCB1 of FIG. 4A) and the connection film FP may be effectively prevented.

In an embodiment, for example, the alignment mark AM is embodied as the opening. In such an embodiment, the connection film FP and the first circuit board (PCB1 of FIG. 4A) may be aligned with each other based on the alignment mark AM in an optical scheme. Thus, the misalignment between the first circuit board (PCB1 of FIG. 4A) and the connection film FP occurring under influence from the first adhesive member ACM1 and the cover CV may be effectively prevented.

The portion of the alignment portion AP may be spaced apart from the first adhesive member ACM1 in the first direction DR1 or in a direction different from the first direction DR1. The alignment mark AM may not overlap the first adhesive member ACM1 and the cover CV in the plan view, such that the misalignment between the first circuit board (PCB1 of FIG. 4A) and the connection film FP occurring under influence from the first adhesive member ACM1 and the cover CV may be effectively prevented.

The first adhesive member ACM1 may be spaced from the cover CV by a predetermined distance in a plan view. However, the disclosure is not limited to what is shown in the drawing, and the first adhesive member ACM1 and the cover CV may partially overlap each other in a plan view.

For convenience of illustration, FIG. 7 shows only an embodiment where the connection film FP and the first circuit board (PCB1 of FIG. 4A) overlap each other. However, this illustration and descriptions as set forth below may be applicable to both a case in which the second circuit board (PCB2 of FIG. 4B) and the connection film FP overlap each other, and a case in which each of the third circuit board (PCB3 of FIG. 3B) and the fourth circuit board (PCB4 of FIG. 3B) overlaps the connection film FP.

In a plan view, the first adhesive member ACM1 may overlap the first pad SPD1. In one embodiment, for example, the first adhesive member ACM1 may substantially overlap the first pad SPD1. "Substantially overlapping" includes not only a case in which the adhesive member expands in a bonding process between the circuit board and the connection film such that the first adhesive member ACM1 may entirely overlap the first pad SPD1, but also a case in which the first adhesive member ACM1 overlaps only a substantial portion of the first pad SPD1.

In a similar manner, although not shown in the drawing, the second adhesive member (ACM2 of FIG. 4A) may substantially overlap the second pad (SPD2 of FIG. 4A).

In a plan view, the first adhesive member ACM1 may overlap a portion of the first connection pad CPD1. The disclosure is not limited to what is shown in the drawings, and the first adhesive member ACM1 may entirely overlap the first connection pad CPD1.

Similarly, although not shown in the drawings, the second adhesive member (ACM2 of FIG. 4A) may substantially overlap the second connection pad (CPD2 of FIG. 4A).

The cover CV may not overlap the first adhesive member ACM1 in a plan view. In an embodiment, for example, the cover CV may not substantially overlap the first adhesive member ACM1 in the plan view. "Not substantially overlapping" includes a case in which the adhesive member expands in the bonding process between the circuit board and the connection film such that the cover CV and the first adhesive member ACM1 may partially overlap each other. However, "at least partially not overlapping" excludes a case in which the cover CV and the first adhesive member ACM1 may entirely overlap each other.

Figure 8A:
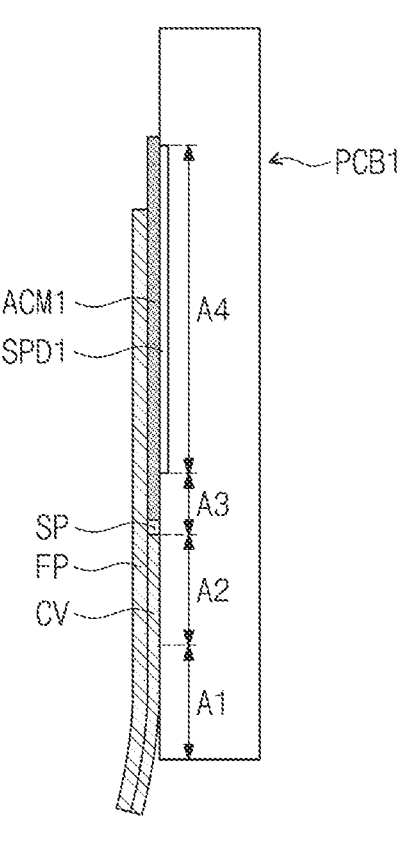
FIG. 8A and FIG. 8B are cross-sectional views of a portion of FIG. 7.
Figure 8A:
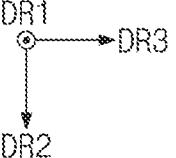
Figure 8B:
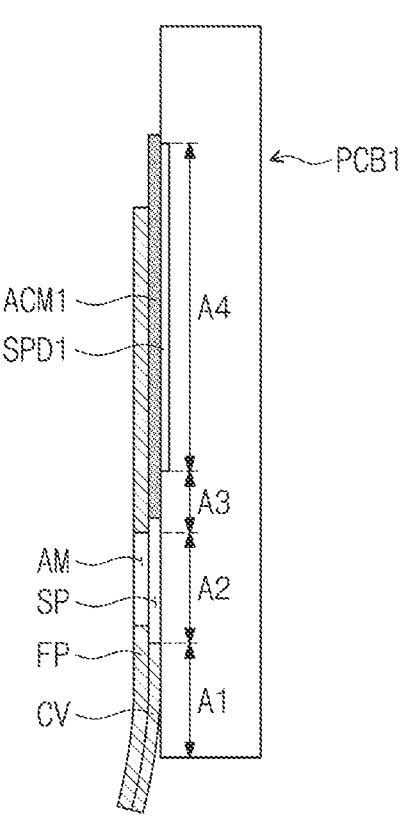
Figure 8B:
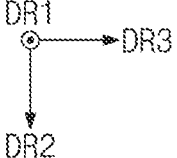

FIG. 8A is a cross-sectional view as taken along I-I' of FIG. 7, and FIG. 8B is a cross-sectional view as taken along II-II' of FIG. 7.

Specifically, FIG. 8A is a cross-sectional view in the third direction DR3 of a portion of the first portion P1 that does not overlap the alignment mark AM. FIG. 8B is a cross-sectional view in the third direction DR3 of a portion of the first portion P1 overlapping the alignment mark AM. For convenience of description, only the first adhesive member ACM1 is described below. However, this description may be applied to the second adhesive member ACM2 as well. Further, in FIG. 8A the alignment portion AP is omitted for convenience of illustration.

As shown in the drawing, the cover CV may substantially contact the first circuit board PCB1. "Substantially contact" includes a case in which the cover CV and the first circuit board FCB1 are partially spaced from each other by a predetermined distance due to a force applied to the cover CV, the connection film FP, or the first circuit board PCB1, for example, gravity.

Specifically, in FIGS. 8A and 8B, a force acting in a direction opposite to the third direction DR3 may be applied to the connection film FP and the cover CV. In an embodiment, for example, the opposite direction to the third direction DR3 may be the gravity direction. In such an embodiment, the connection film FP and the cover CV may be partially bent in the direction opposite to the third direction DR3 due to a weight of each of the connection film FP and the cover CV.

A shape of each of the connection film FP and the cover CV is not limited to what is shown in the drawings. In an alternative embodiment, for example, when a force that cancels the force acting in the opposite direction to the third direction DR3 acts, or a force acting in the third direction DR3 does not affect the shape of each of the connection film FP and the cover CV, or each of the connection film FP and the cover CV is made of a material so rigid that the shape thereof is not changed due to the force acting in the third direction DR3, each of the connection film FP and the cover CV may extend in the second direction DR2 while not being bent in the third direction DR3.

Referring to FIG. 8A, the first circuit board PCB1, the first adhesive member ACM1, and the connection film FP may partially overlap each other in a plan view or in the third direction DR3.

In a first area A1, the base film BF of the connection film FP, the cover CV, and the first circuit board PCB1 may overlap each other. In a second area A2, the base film BF, the cover CV, and the first circuit board PCB1 may overlap each other. In a third area A3, the base film BF, the first adhesive member ACM1, and the first pad SPD1 of the first circuit board PCB1 may overlap each other. The space SP may be formed in the third area A3. In a fourth area A4, the base film BF, the first adhesive member ACM1, and the first pad SPD1 may overlap each other.

That is, in a vertical cross-sectional view of a portion of the first portion P1 that does not overlap the alignment mark AM, the cover CV may overlap the first area A1 and the second area A2.

In such an embodiment, the space SP between the first circuit board PCB1 and the connection film FP may be minimized to effectively prevent the foreign material from flowing into the space SP.

Although the figure shows an embodiment where the cover CV entirely overlaps the second area A2, the disclosure is not limited to what is shown in the figure and the cover CV may partially overlap the second area A2.

Referring to FIG. 8B, the first circuit board PCB1, the first adhesive member ACM1, and the connection film FP may partially overlap each other in a plan view.

In the first area A1, the base film BF, the cover CV, and the first circuit board PCB1 may overlap each other. In the second area A2, the base film BF, the alignment mark AM, and the first circuit board PCB1 may overlap each other. In the third area A3, the base film BF, the first adhesive member ACM1, and the first pad SPD1 of the first circuit board PCB1 may overlap each other. In this case, the space SP may be formed in the second area A2 and the third area A3. In the fourth area A4, the base film BF, the first adhesive member ACM1, and the first pad SPD1 may overlap each other.

The first adhesive member ACM1 is not limited to what is shown in the drawing. The first adhesive member ACM1 may not overlap the third area A3 but may overlap the fourth area A4. However, the disclosure is not limited to any one embodiment.

In a plan view, the alignment mark AM may be spaced from each of the first area A1 and the fourth area A4 by a predetermined distance, and may be adjacent to the third area A3.

However, the disclosure is not limited to what is shown in the figure. The alignment mark AM may partially overlap the second area A2 and may non-overlap with the third area A3.

That is, in a vertical sectional view of a portion of the first portion P1 overlapping the alignment mark AM, the cover CV may overlap the first area A1, but may not overlap the second area A2.

In the second area A2, the alignment mark AM may not overlap the cover CV and the first adhesive member ACM1. According to an embodiment of the disclosure, where the alignment mark AM is embodied as the opening extending through the base film BF, the cover CV or the first adhesive member ACM1 may overlap the alignment mark AM to prevent the misalignment between the first circuit board PCB1 and the connection film FP.

In the drawing, only a case where the alignment mark AM is embodied as the opening (AM-OP of FIG. 6B) is shown. However, the structure of the alignment mark AM is not limited thereto. The alignment mark AM may be embodied as the protrusion partially protruding from the base film BF, or as the recess partially depressed into the base film BF. However, the disclosure is not limited to any one embodiment.

The display device according to an embodiment of the disclosure may effectively prevent the foreign material from flowing into the space between the circuit board and the connection film.

The display device according to an embodiment of the disclosure may reduce the space between the circuit board and the connection film into which the foreign material may flow.

The display device according to an embodiment of the disclosure may minimize the space between the circuit board and the connection film into which the foreign material flows, thereby effectively preventing the misalignment between components of the display device.

The invention should not be construed as being limited to the embodiments set forth herein. Rather, these embodiments are provided so that this disclosure will be thorough and complete and will fully convey the concept of the invention to those skilled in the art.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A display device comprising:
a display panel including a plurality of pixels and a plurality of display pads respectively connected to the pixels;
a first circuit board including a first pad electrically connected to a first display pad among the display pads;

a second circuit board including a second pad electrically connected to a second display pad among the display pads;

a connection film connected to the first circuit board and the second circuit board, wherein the connection film includes:

a base film;

a first connection pad disposed on a front surface of the base film and electrically connected to the first pad;

a second connection pad disposed on the front surface of the base film and electrically connected to the second pad;

a signal line connecting the first connection pad and the second connection pad to each other; and an alignment mark disposed on the front surface of the base film, wherein the alignment mark is spaced apart from the first connection pad and the second connection pad in a plan view of the display device; and a cover disposed on the front surface of the base film, wherein the cover is spaced apart from the alignment mark in the plan view.

2. The display device of claim 1, wherein the first pad and the second pad are arranged along a first direction, wherein the first connection pad and the second connection pad are arranged along the first direction and are spaced apart from each other by a predetermined distance, wherein the alignment mark is spaced from the first connection pad and the second connection pad by a predetermined distance in a direction different from the first direction.

3. The display device of claim 1, further comprising:

a first adhesive member disposed between the first circuit board and the connection film; and a second adhesive member disposed between the second circuit board and the connection film, wherein the first adhesive member substantially overlaps the first pad in the plan view, wherein the second adhesive member substantially overlaps the second pad in the plan view.

4. The display device of claim 3, wherein the first adhesive member overlaps a portion of the first connection pad in the plan view, wherein the second adhesive member overlaps a portion of the second connection pad in the plan view.

5. The display device of claim 3, wherein the cover does not substantially overlap the first adhesive member and the second adhesive member in the plan view.

6. The display device of claim 2, wherein the alignment mark includes a plurality of alignment marks, wherein the connection film includes:

a first portion in which the first connection pad and at least one of the alignment marks is disposed;

a second portion spaced apart from the first portion in the first direction, wherein the second connection pad and at least another one of the alignment marks is disposed in the second portion; and a third portion connecting the first portion and the second portion to each other, wherein the signal line is disposed in the third portion, wherein the third portion includes a bent portion bent along the first direction, wherein the signal line extends along the bent portion.

7. The display device of claim 1, wherein the alignment mark is defined by an opening defined in the base film.

8. The display device of claim 1, wherein the cover is integrally formed with the connection film as a single unitary and indivisible part.

9. The display device of claim 1, wherein the cover is substantially in contact with at least one selected from the first circuit board and the second circuit board.

10. The display device of claim 1, further comprising:

a circuit film connecting the first circuit board and the display panel to each other and connecting the second circuit board and the display panel to each other, wherein the first pad is electrically connected to the first display pad via the circuit film;

wherein the second pad is electrically connected to the second display pad via the circuit film.

11. The display device of claim 1, further comprising:

a third circuit board including a third pad electrically connected to a third display pad among the display pads;

a fourth circuit board including a fourth pad electrically connected to a fourth display pad among the display pads; and an additional connection film electrically connecting the third circuit board and the fourth circuit board to each other, wherein the third circuit board and the fourth circuit board are spaced apart from each other in the first direction.

12. The display device of claim 1, further comprising:

a lower member interposed between the display panel and the connection film.

13. The display device of claim 12, further comprising:

a securing member interposed between the connection film and the lower member, wherein the securing member fixes the lower member and the connection film to each other.

14. A display device comprising:

a display panel including a plurality of pixels and a plurality of display pads respectively connected to the pixels;

a light conversion panel disposed opposite to the display panel;

a first circuit board including a first pad electrically connected to a first display pad among the display pads;

a second circuit board including a second pad electrically connected to a second display pad among the display pads;

a connection film connected to the first circuit board and the second circuit board, wherein the connection film includes:

a base film;

a first connection pad disposed on a front surface of the base film and electrically connected to the first circuit board;

a second connection pad disposed on the front surface of the base film and electrically connected to the second circuit board;

a signal line connecting the first connection pad and the second connection pad to each other; and an alignment mark disposed on the front surface of the base film, wherein the alignment mark is spaced apart from the first connection pad and the second connection pad in a plan view of the display device; and a cover disposed on the front surface of the base film, wherein the cover is spaced apart from the alignment mark in the plan view.

15. The display device of claim 14, wherein the first pad and the second pad are arranged along a first direction, wherein the first connection pad and the second connection pad are arranged along the first direction and are spaced apart from each other by a predetermined distance, wherein the alignment mark is spaced from the first connection pad and the second connection pad by a predetermined distance in a direction different from the first direction.

16. The display device of claim 15, further comprising:

a first adhesive member disposed between the first circuit board and the connection film; and a second adhesive member disposed between the second circuit board and the connection film, wherein the first adhesive member substantially overlaps the first pad in the plan view, wherein the second adhesive member substantially overlaps the second pad in the plan view.

17. The display device of claim 14, wherein the alignment mark includes a plurality of alignment marks, wherein the connection film includes:

a first portion in which the first connection pad and at least one of the alignment marks is disposed;

a second portion spaced apart from the first portion in a first direction, wherein the second connection pad and at least another one of the alignment marks is disposed in the second portion; and a third portion connecting the first portion and the first second portion to each other, wherein the signal line is disposed in the third portion, wherein the third portion includes a bent portion bent along the first direction, wherein the signal line extends along the bent portion, wherein the alignment mark is defined by an opening defined in the base film.

18. A display device comprising:

a display panel including a plurality of pixels and a plurality of display pads respectively connected to the pixels;

a first circuit board including a first pad electrically connected to a first display pad among the display pads;

a second circuit board including a second pad electrically connected to a second display pad among the display pads;

a connection film connected to the first circuit board and the second circuit board, wherein the connection film includes:

a base film;

a first connection pad disposed on a front surface of the base film and electrically connected to the first circuit board;

a second connection pad disposed on the front surface of the base film and electrically connected to the second circuit board;

a signal line connecting the first connection pad and the second connection pad to each other; and an alignment mark disposed on the front surface of the base film, wherein the alignment mark is spaced apart from the first connection pad and the second connection pad in a plan view of the display device;

a first adhesive member disposed between the first circuit board and the connection film;

a second adhesive member disposed between the second circuit board and the connection film; and a cover disposed on the front surface of the base film, wherein the cover is spaced apart from the alignment mark in the plan view, wherein the cover does not substantially overlap the first adhesive member and the second adhesive member in the plan view.

19. The display device of claim 18, wherein the alignment mark includes a plurality of alignment marks, wherein the connection film includes:

a first portion in which the first connection pad and at least one of the alignment marks is disposed;

a second portion spaced apart from the first portion in one direction parallel to a direction in which the first connection pad and the second connection pad are arranged, wherein the second connection pad and at least another one of the alignment marks is disposed in the second portion; and a third portion connecting the first portion and the second portion to each other, wherein the signal line is disposed in the third portion, wherein the third portion includes a bent portion bent along the one direction, wherein the signal line extends along the bent portion, wherein the alignment mark is defined by an opening defined in the base film.

20. The display device of claim 19, further comprising:

a circuit film connecting the first circuit board and the display panel to each other and connecting the second circuit board and the display panel to each other, wherein the first pad is electrically connected to the first display pad via the circuit film;

wherein the second pad is electrically connected to the second display pad via the circuit film.

* * * * *